Nov. 4, 1969 R. C. SHARPLES 3,476,900

SWITCH ASSEMBLIES FOR USE WITH PRINTED CIRCUITS

Filed Nov. 27, 1967

INVENTOR
R. C. Sharples
BY [signature]
ATTORNEYS

United States Patent Office 3,476,900
Patented Nov. 4, 1969

3,476,900

SWITCH ASSEMBLIES FOR USE WITH PRINTED CIRCUITS

Richard Colin Sharples, Burnley, England, assignor to Joseph Lucas (Industries) Limited, Birmingham, England, a British company Filed Nov. 27, 1967, Ser. No. 685,800
Claims priority, application Great Britain, Dec. 9, 1966, 55,171/66
Int. Cl. H01h 9/54
U.S. Cl. 200—166 2 Claims

ABSTRACT OF THE DISCLOSURE

A switch assembly for use with a flexible printed circuit includes a base, having a ramp surface thereon over which an exposed conductor of a flexible printed circuit extends in use. A switch body is secured to the base and houses a switch mechanism and a resilient conductive strip-like contact is mounted on the exterior of the switch body and is electrically connected to a switch contact within the switch mechanism. The free end of the resilient strip-like contact is inclined with respect to the base and rides on said ramp surface as the switch body is secured to the base so as to make an electrical connection between said switch contact and the exposed conductor of the printed circuit.

This invention relates to switch assemblies for use with flexible printed circuits.

A switch assembly according to the invention includes a base, a ramp surface on the base, over which an exposed conductor of a flexible printed circuit extends in use, a switch body secured to the base and housing a switch mechanism, and a resilient, conductive, strip-like contact mounted on the exterior of said switch body and electrically connected to a switch contact within the switch mechanism, the free end of said resilient strip-like contact being inclined with respect to said base and riding on said ramp surface as said switch body is secured to said base, so as to make an electrical connection between said switch contact and said exposed conductor of the printed circuit.

Figure 1:
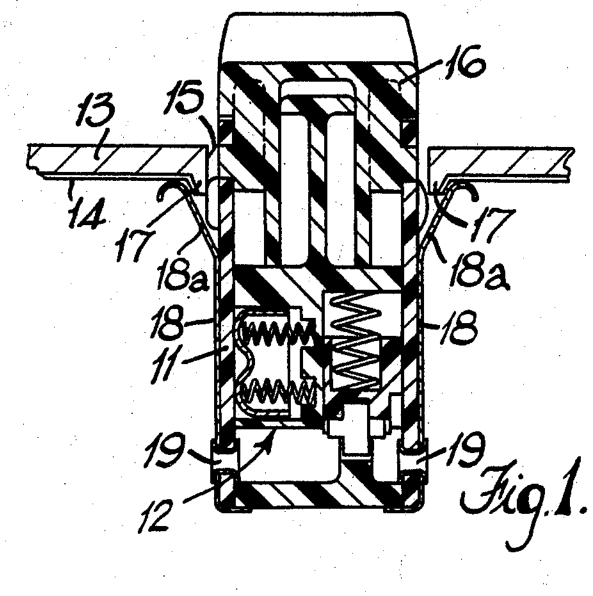
Figure 2:
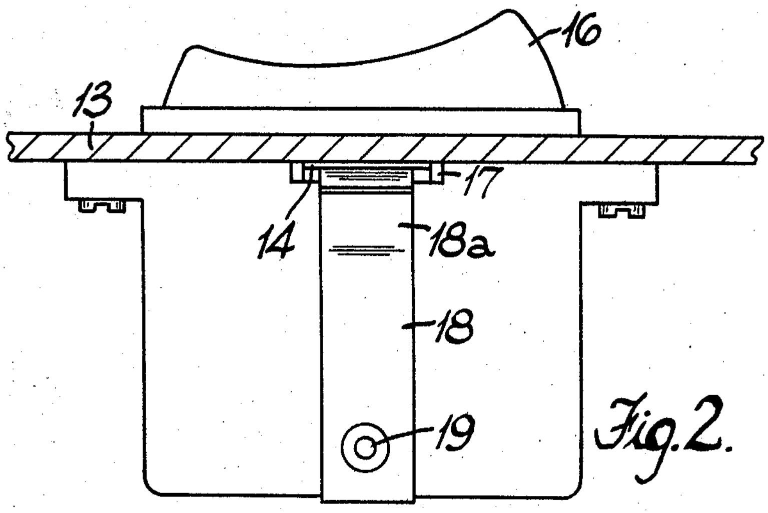

In the accompanying drawings, FIGURE 1 is a sectional view of a switch assembly in accordance with one example of the invention, and FIGURE 2 is a side elevational view of the assembly shown in FIGURE 1.

Referring to the drawings, the switch assembly includes a switch body 11 housing the switch mechanism 12, the body having integral lugs (not shown) through which the body 11 can be secured to a base 13 over which a flexible printed circuit 14 extends. The base 13 is formed with a hole 15 through which the operating member 16 of the switch is accessible, and includes a pair of ramps 17 at opposite edges of the hole 15.

A plurality of resilient strip-like contacts 18 are secured at one end to the body 11 by rivets 19, the rivets

19 serving to electrically connect the contacts 18 with respective contact pieces within the switch mechanism 12. At their other ends the contacts 18 are formed with outwardly inclined portions 18*a*.

In use, the flexible printed circuit 14 is arranged on the base 13 in such a manner that exposed conductive areas of the circuit are located on the ramps 17. When the body 11 is secured to the base 13 the portions 18*a* of the contacts 18 ride on the ramps 17 and make electrical contact with the exposed conductive areas of the circuit and thereby make the required electrical connections to the switch. The arrangement is such that the contacts 18 are flexed when they engage the ramps 17 thereby ensuring a good electrical connection between the exposed areas of the circuit and the contacts 18.

Having thus described my invention, what I claim as new and desire to secure by Letters Patent is:

1. A switch assembly for use with a printed circuit including a base, an aperture through said base, a ramp surface on the base adjacent said aperture, said ramp surface being inclined to an axis extending at right angles through said base, a flexible printed circuit extending over said base and having an exposed conductor on said ramp surface, a switch body secured to the base and housing a switch mechanism, and a resilient, conductive, strip-like contact mounted on the exterior of said switch body and electrically connected to a switch contact within the switch mechanism, the free end of said resilient strip-like contact being inclined with respect to said base and lining on said ramp surface as said body is secured to said base, so as to make an electrical connection between said switch contact and said exposed conductor of the printed circuit.

2. A switch assembly as claimed in claim 1 further including a second ramp surface on said base over which a second exposed conductor of the flexible printed circuit extends and a second resilient, conductive, strip-like contact mounted on the exterior of said switch body and electrically connected to a second switch contact within the switch mechanism, the free end of said second resilient strip-like contact being inclined with respect to said base and riding on said second ramp surface as said switch body is secured to the base, so as to make an electrical connection between said second switch contact and said second exposed conductor.

References Cited

UNITED STATES PATENTS

| | | | |
|---|---|---|---|
| 2,908,743 | 10/1959 | Premoshis | 174—53 |
| 3,085,139 | 4/1963 | Wright. | |
| 3,272,951 | 9/1966 | O'Brien. | |
| 3,311,790 | 3/1967 | Vizzier et al. | |
| 3,363,077 | 1/1968 | Goop. | |

H. O. JONES, Primary Examiner

U.S. Cl. X.R.

200—168; 317—101